(12) United States Patent
Kim

(10) Patent No.: US 10,185,168 B2
(45) Date of Patent: Jan. 22, 2019

(54) DISPLAY DEVICE

(71) Applicant: LG DISPLAY CO., LTD., Seoul (KR)

(72) Inventor: Hyunwoo Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/608,628

(22) Filed: May 30, 2017

(65) Prior Publication Data

US 2017/0371198 A1  Dec. 28, 2017

(30) Foreign Application Priority Data

Jun. 28, 2016  (KR) ........................ 10-2016-0081099

(51) Int. Cl.
*G02F 1/1333* (2006.01)
*H01L 51/50* (2006.01)
*H01L 51/00* (2006.01)

(52) U.S. Cl.
CPC .... *G02F 1/133308* (2013.01); *H01L 51/0006* (2013.01); *H01L 51/5012* (2013.01); *G02F 2001/133314* (2013.01); *G02F 2001/133322* (2013.01); *G02F 2201/465* (2013.01)

(58) Field of Classification Search
None
See application file for complete search history.

(56) References Cited

U.S. PATENT DOCUMENTS

| | | | | |
|---|---|---|---|---|
| 5,214,565 A | * | 5/1993 | Flores | H01H 85/47 |
| | | | | 165/185 |
| 5,442,142 A | * | 8/1995 | Hayashi | H05K 1/0263 |
| | | | | 174/250 |
| 6,501,030 B1 | * | 12/2002 | Parizi | H01R 12/585 |
| | | | | 174/250 |
| 6,583,988 B1 | * | 6/2003 | Lyons | H05K 7/20854 |
| | | | | 165/185 |
| 6,611,433 B1 | * | 8/2003 | Lee | G06F 1/184 |
| | | | | 361/736 |
| 6,791,825 B1 | * | 9/2004 | Taylor | G06F 1/1626 |
| | | | | 361/679.6 |
| 7,542,286 B2 | * | 6/2009 | Kang | G06F 1/1601 |
| | | | | 361/690 |

(Continued)

FOREIGN PATENT DOCUMENTS

| KR | 2019900013976 | 7/1990 |
|---|---|---|
| KR | 1020070020718 | 2/2007 |

*Primary Examiner* — Xanthia C Cunningham
(74) *Attorney, Agent, or Firm* — Seed Intellectual Property Law Group LLP

(57) ABSTRACT

The present disclosure relates to a display device including a display module, cover bottom, a PCB, and a cover shield. The PCB includes a guide hole formed therethrough in a thickness direction and coupled to the cover bottom to be disposed on a rear surface of the cover bottom. The cover shield includes a guide protrusion configured to protrude from one surface at a position corresponding to the guide hole to be inserted into the guide hole and configured to be coupled to the cover bottom to cover the PCB. Accordingly, the cover shield is configured in such a way that the guide protrusion of the cover shield is inserted into the guide hole of the PCB interposed between the cover bottom and the cover shield while the cover shield is coupled to the cover bottom, thereby more easily and accurately guiding an assembly position of the cover shield.

20 Claims, 8 Drawing Sheets

(56) References Cited

U.S. PATENT DOCUMENTS

| | | | | |
|---|---|---|---|---|
| 7,619,891 B2* | 11/2009 | Woo | ................... | H05K 7/20963 345/41 |
| 8,040,454 B2* | 10/2011 | Lee | ................... | G02F 1/133308 349/58 |
| 8,092,115 B1* | 1/2012 | McLeod | ................... | H04Q 1/02 312/223.2 |
| 8,848,349 B2* | 9/2014 | Ke | ................... | H05K 5/02 361/679.01 |
| 2004/0034994 A1* | 2/2004 | Chang | ................... | H05K 7/142 29/760 |
| 2006/0044745 A1* | 3/2006 | Kim | ................... | G06F 1/1601 361/679.22 |
| 2007/0195219 A1* | 8/2007 | Moon | ................... | G06F 1/1626 349/58 |
| 2008/0079888 A1* | 4/2008 | Park | ................... | G02F 1/13452 349/149 |
| 2008/0266485 A1* | 10/2008 | Shen | ................... | G02F 1/133308 349/59 |
| 2009/0135568 A1* | 5/2009 | Jeong | ................... | H05K 1/147 361/749 |
| 2010/0311255 A1* | 12/2010 | Reisinger | ................... | H01R 12/7052 439/74 |
| 2011/0255261 A1* | 10/2011 | Tracy | ................... | G06F 1/1616 361/807 |
| 2012/0134123 A1* | 5/2012 | Hwang | ................... | H05K 7/1404 361/752 |
| 2013/0301203 A1* | 11/2013 | Kameda | ................... | G06F 1/1601 361/679.21 |
| 2014/0009897 A1* | 1/2014 | Tang | ................... | H05K 7/12 361/759 |
| 2014/0126125 A1* | 5/2014 | Yamamoto | ................... | G02F 1/133308 361/679.01 |
| 2014/0262473 A1* | 9/2014 | Robinson | ................... | H05K 9/0032 174/372 |
| 2015/0282334 A1* | 10/2015 | Yamamoto | ................... | G02F 1/133308 362/97.1 |
| 2015/0370120 A1* | 12/2015 | Song | ................... | G02F 1/133382 349/58 |
| 2016/0116790 A1* | 4/2016 | Do | ................... | G02B 6/0051 349/58 |
| 2016/0291243 A1* | 10/2016 | Okitsu | ................... | G02B 6/0085 |
| 2016/0301442 A1* | 10/2016 | Sohn | ................... | H04B 1/3888 |
| 2016/0316583 A1* | 10/2016 | Bang | ................... | H05K 7/20963 |
| 2016/0353593 A1* | 12/2016 | Park | ................... | F16M 11/16 |
| 2016/0360628 A1* | 12/2016 | Yu | ................... | G02B 6/0088 |
| 2017/0118832 A1* | 4/2017 | Roh | ................... | H05K 7/20963 |
| 2017/0176806 A1* | 6/2017 | Kang | ................... | G02B 6/0083 |

* cited by examiner (Prior Art)

30

(Prior Art)

DISPLAY DEVICE

CROSS-REFERENCE TO RELATED APPLICATIONS

This application claims the priority of Korean Patent Application No. 10-2016-0081099 filed on Jun. 28, 2016, in the Korean Intellectual Property Office, the disclosure of which is hereby incorporated by reference in its entirety.

BACKGROUND

Technical Field

The present disclosure relates to a display device.

Description of the Related Art

A display device is a device for visually displaying data and is, for example, a liquid crystal display device (LCD), an electrophoretic display device, an organic light emitting display device, an electro luminescent display device, a field emission display device, a surface-conduction electron-emitter display device, a plasma display device, a cathode ray display device, and so on.

Thereamong, recently, an LCD has attracted much attention due to advantages of mass production technology, ease of a driver, realization of high image quality, and realization of a large size screen.

An LCD is an electronic device that converts various electrical information items generated from a plurality of devices into visual information using change in liquid crystal transmittance according to an applied voltage and transmits the visual information. LCDs have been widely used as alternative means for overcoming disadvantages of a conventional cathode ray tube (CRT) because the LCDs are driven at low power, are thin, and realizes excellent image quality.

An LCD broadly includes a display panel, a circuit unit, and a backlight unit. The display panel adjusts an amount of transmitted light to display an image, the circuit unit applies a plurality of signals transmitted from a driving system to the display panel and controls the signals, and the backlight unit is used as a lighting device that uniformly emits light to an entire portion of the display panel.

The circuit unit is configured as including various circuit devices, a printed circuit board (PCB), and so on and controls an overall operation of the LCD.

The PCB included in the circuit unit is bent to a rear surface of a cover bottom during a modularization procedure of various components and is positioned on the rear surface of the cover bottom. The PCB positioned on the rear surface of the cover bottom is protected from externally applied force or externally introduced impurities by a cover shield.

FIG. 1 is a rear-side perspective view illustrating an example of a cover shield applied to a conventional display device. FIG. 2 is a cross-sectional view of the display device illustrated in FIG. 1. FIG. 3 is a cross-sectional view of the cover shield illustrated in FIG. 1.

Referring to FIGS. 1 to 3, in the conventional display device, a PCB 20 positioned on a rear surface of a cover bottom 10 and a cover shield 30 for covering and protecting the PCB 20 are coupled to the cover bottom 10 by a coupling member 40.

A procedure of coupling the PCB 20 and the cover shield 30 to the cover bottom 10 is now schematically described. The PCB 20 is disposed on a rear surface of the cover bottom 10 and the cover shield 30 is disposed on the rear surface of the cover bottom 10 so as to cover the PCB 20. In this case, the cover shield 30 may be disposed on the rear surface of the cover bottom 10 to allow a protrusion 15 protruding from the rear surface of the cover bottom 10 to be inserted into a hole 35 formed in a flange portion (first end, 32) so as to guide an assembly position of the cover shield 30 with respect to the cover bottom 10 and the PCB 20.

As illustrated in FIG. 2, the cover shield 30 may be shaped as including three step differences. That is, the cover shield 30 includes the first end 32 that contacts the rear surface of the cover bottom 10, a second end 36 that contacts the PCB 20 and at which the coupling member 40 is positioned, and a third end 34 that is spaced apart from the PCB 20 and covers the PCB 20. The structure for guiding the assembly position of the cover shield 30 is positioned on the rear surface of the cover bottom 10 and, thus, the cover shield 30 necessarily includes the first end 32 that contacts the rear surface of the cover bottom 10.

As the size of a display device is increased, the size of a PCB that controls and drives an overall operation of a display device has also increased, in accordance with current trends. In addition, the size of the cover shield 30 for covering the PCB 20 has also increased.

As the size of the cover shield 30 is increased, bending stiffness of the cover shield 30 is degraded. That is, as the size of the cover shield 30 is increased, the cover shield 30 is more easily bent by low external force. In particular, when the cover shield 30 applied to the conventional display device is bent because the cover shield 30 is shaped as including a total of three ends, a lowest-level portion of the first end 32 frequently raises, as illustrated in FIG. 2.

When the edge of the first end 32 of the cover shield 30, which contacts the rear surface of the cover bottom 10, is lifted, noise may be generated as the first end 32 comes in contact with the rear surface of the cover bottom 10 according to external force applied to the device when the device is driven or moved. This is the reason for degradation in quality of the display device.

As illustrated in FIG. 3, the cover shield 30 including a total of three ends has high variation due to bending because the first end 32 and the third end 34 have a relatively high step (or height) difference. That is, when the cover shield 30 is bent according to external force and is greatly deformed as indicated by dotted lines of FIG. 3, it is not possible to restore the cover shield 30 and, thus, the cover shield 30 may be permanently deformed. The cover shield 30 that is permanently deformed is defective and, thus, is not capable of being applied to the display device and is discarded, causing a loss in cost.

BRIEF SUMMARY

It is an object of the present disclosure to provide a display device including a cover shield that is shaped for enhanced bending stiffness, which is obtained by changing a structure for guiding an assembling position of the cover shield.

It is an object of the present disclosure to provide a display device for minimizing noise between a cover shield and another component adjacent thereto by changing a shape of the cover shield.

It is an object of the present disclosure to provide a display device for restricting permanent shape variation of the cover shield by enhancing the bending stiffness of the cover shield and changing a shape of the cover shield.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and any combination thereof.

In accordance with one aspect of the present disclosure, a display device may include a display module, a cover bottom, a printed circuit board (PCB), and a cover shield.

Here, the PCB may include a guide hole formed therethrough in a thickness direction and coupled to the cover bottom to be disposed on a rear surface of the cover bottom. The cover shield may include a guide protrusion configured to protrude from one surface at a position corresponding to the guide hole to be inserted into the guide hole and configured to be coupled to the cover bottom to cover the PCB.

The cover shield may be configured in such a way that the guide protrusion of the cover shield is inserted into the guide hole of the PCB interposed between the cover bottom and the cover shield while the cover shield is coupled to the cover bottom, thereby more easily and accurately guiding an assembly position of the cover shield. In addition, differently from the conventional case, a guide structure for guiding an assembly position of the cover shield is disposed directly on the PCB and the cover shield, but not on the cover bottom, so as to change a shape of the cover shield, thereby enhancing the stiffness of the cover shield.

DETAILED DESCRIPTION

Figure 1:
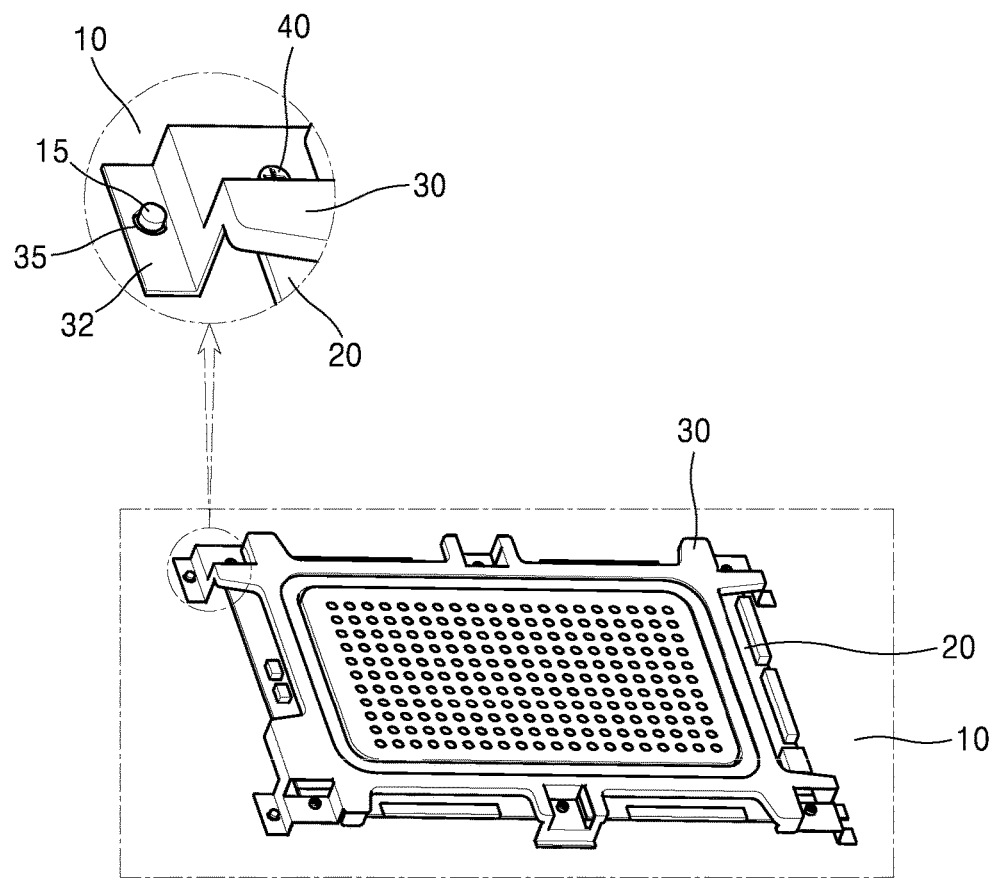
FIG. 1 is a rear-side perspective view illustrating an example of a cover shield applied to a conventional display device.
Figure 2:
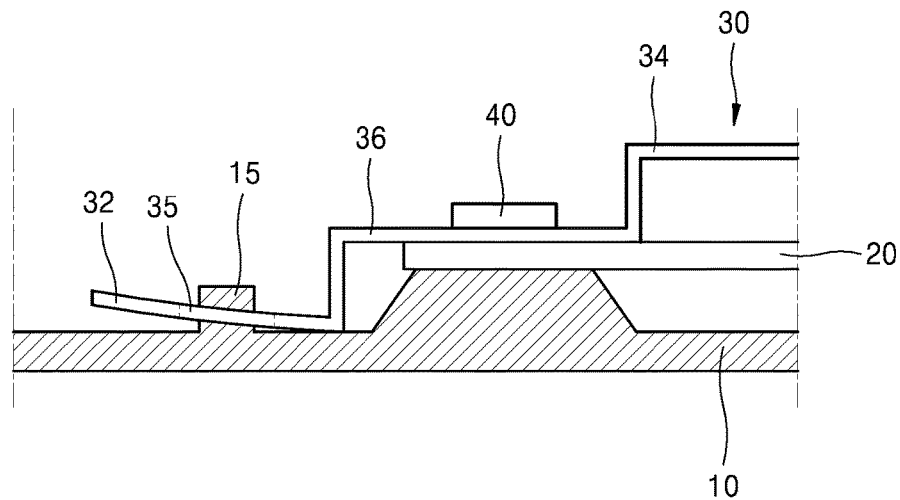
FIG. 2 is a cross-sectional view of the display device illustrated in FIG. 1.
Figure 3:
FIG. 3 is a cross-sectional view of the cover shield illustrated in FIG. 1.

The above objects, features and advantages will become apparent from the detailed description with reference to the accompanying drawings. Embodiments are described in sufficient detail to enable those skilled in the art in the art to easily practice the technical idea of the present disclosure.

Detailed descriptions of well known functions or configurations may be omitted in order not to unnecessarily obscure the gist of the present disclosure. Throughout the drawings, like reference numerals refer to like elements.

Thicknesses of layers and regions are expanded in the drawings for clarity. For descriptive convenience, thicknesses of some layers and regions are exaggerated in the drawings.

Hereinafter, it will be understood that when an element is referred to as being "on" or "under" another element, the element can be directly on another element or intervening elements.

It will be understood that when an element is referred to as being "on", "connected to" or "coupled to" another element, it may be directly on, connected or coupled to the other element or intervening elements may be present.

Hereinafter, the present disclosure will be described in detail by explaining exemplary embodiments of the present disclosure with reference to the attached drawings.

Figure 4:
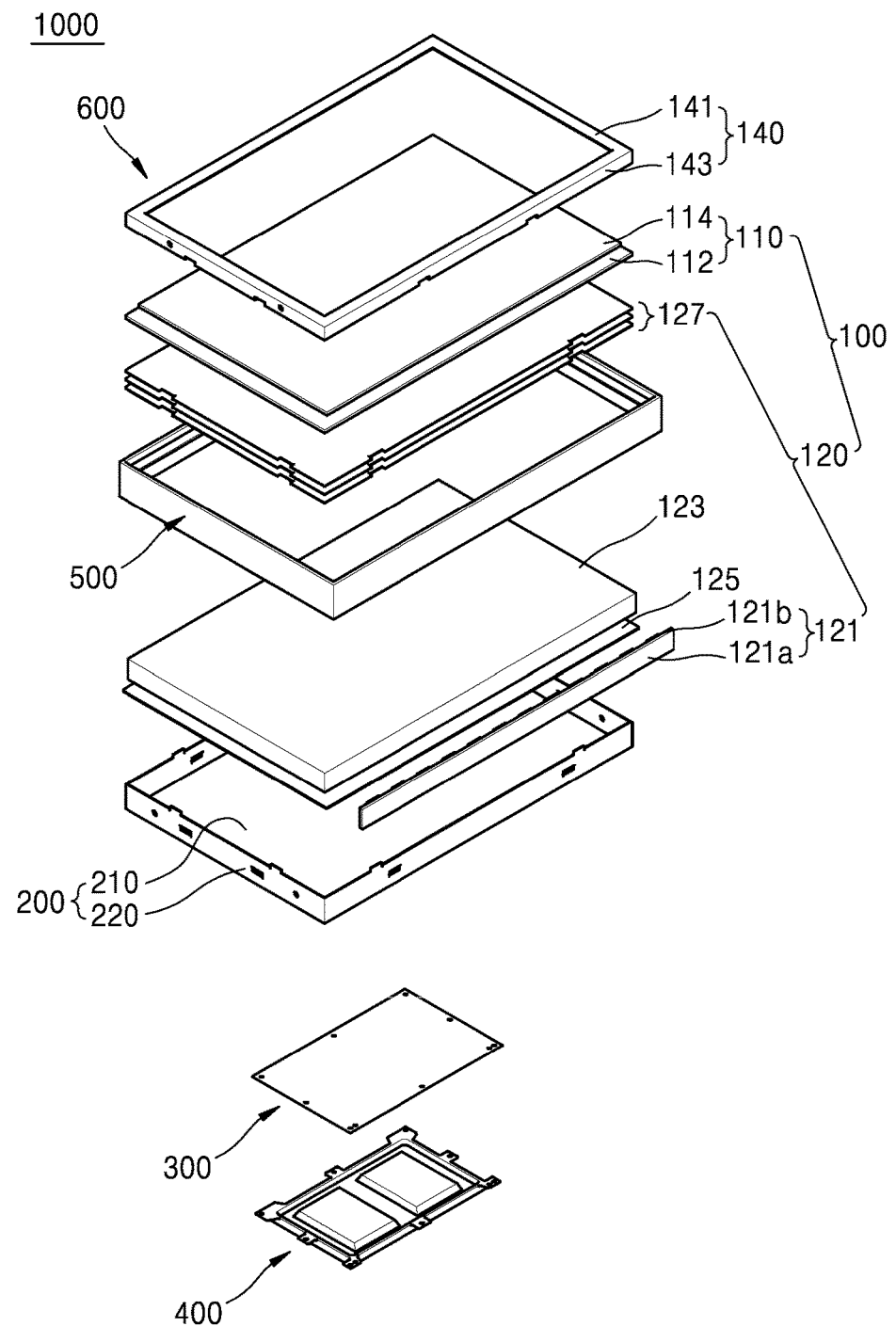
FIG. 4 is an exploded perspective view of a display device according to an exemplary embodiment of the present disclosure.

FIG. 4 is an exploded perspective view of a display device 1000 according to an exemplary embodiment of the present disclosure.

Referring to FIG. 4, the display device 1000 according to an exemplary embodiment of the present disclosure may include a display module 100, a cover bottom 200, a printed circuit board (PCB) 300, and a cover shield 400 and may further include a guide panel 500 and a case top 600.

Although FIG. 4 illustrates the case in which the display device 1000 according to the present embodiment is a liquid crystal display device, however, a type of the display device 1000 according to the present embodiment is not limited thereto. Hereinafter, the display device 1000 according to the present embodiment will be exemplified as a liquid crystal display device.

The display module 100 may include a display panel 110 for displaying an image and a backlight unit 120 that is positioned on a rear surface of the display panel 110 and provides light to the display panel 110. However, as a type of the display device 1000 according to the present embodiment is changed, some components of the display module 100 may be omitted or other components may be added to the display module 100.

The display panel 110 may be disposed in or adjacent to a front of the display device 1000 and may display an image. With regard to a description of the display device 1000 according to the present embodiment, a direction in which a display surface of the display panel 110 is directed is referred to as a forward direction and a direction in which an opposite surface of the display surface of the display panel 110 is directed is referred to as a backward direction. Accordingly, the display surface of the display panel 110 may be a front surface of the display panel 110 and the opposite surface to the display surface may be a rear surface of the display panel 110. In addition, the forward direction and the backward direction which indicate directions may correspond to an upward direction and a downward direction, respectively.

The display panel 110 may include a first substrate 112, a second substrate 114 stacked on the first substrate 112, and a liquid crystal layer (not shown) interposed between the first substrate 112 and the second substrate 114.

The first substrate 112 may be formed with a larger size than the second substrate 114. A driver (not shown) may be mounted in the form of a chip in one region of the first substrate 112 that is not covered by the second substrate 114.

The driver may be connected to the PCB 300 to be described later using a connection member (not shown) such as a flexible printed circuit board or a tape carrier package as a medium.

The backlight unit 120 may be positioned on the rear surface of the display panel 110 and may supply a surface light source to the display panel 110. The backlight unit 120 may include a light source portion 121, a light guide plate 123, a reflective sheet 125, and an optical sheet 127.

The light source portion 121 may include a circuit board 121a and a plurality of light sources 121b that are mounted on the circuit board 121a to be spaced apart from each other. The light guide plate 123 may provide light emitted from the light source portion 121 to the display panel 110 in the form of a surface light source.

The reflective sheet 125 may be positioned on a rear surface of the light guide plate 123. The reflective sheet 125 may reflect the emitted light to the rear surface of the light guide plate 123 toward the display panel 110 to enhance the brightness of light. The optical sheet 127 (which may include one or more optical sheets, as shown) may be positioned on the front surface of the light guide plate 123. The optical sheet 127 may enhance the efficiency of light emitted from the light guide plate 123 and provide the light to the display panel 110.

The cover bottom 200 may accommodate and support the display module 100, that is, the display panel 110 and the backlight unit 120. The cover bottom 200 may include an accommodation portion 210 with the backlight unit 120 accommodated thereon and may be shaped like a plate and a plurality of lateral surface portions 220 that are bent and extend upward from edges of the accommodation portion 210.

The guide panel 500 may accommodate and support the display module 100 along with the cover bottom 200. The display panel 110 of the display module 100 may be supported by the guide panel 500 at a rear surface of the display panel 110. The guide panel 500 may be coupled to the cover bottom 200 outside or inside the cover bottom 200 so as to cover an external portion of the backlight unit 120 accommodated in the cover bottom 200.

The case top 600 may be coupled to the guide panel 500 and the cover bottom 200 or may be selectively coupled to any one of the guide panel 500 and the cover bottom 200 so as to cover a front edge of the display panel 110 and an external surface of the guide panel 500. The case top 600 may be omitted depending on the cases.

Figure 5:
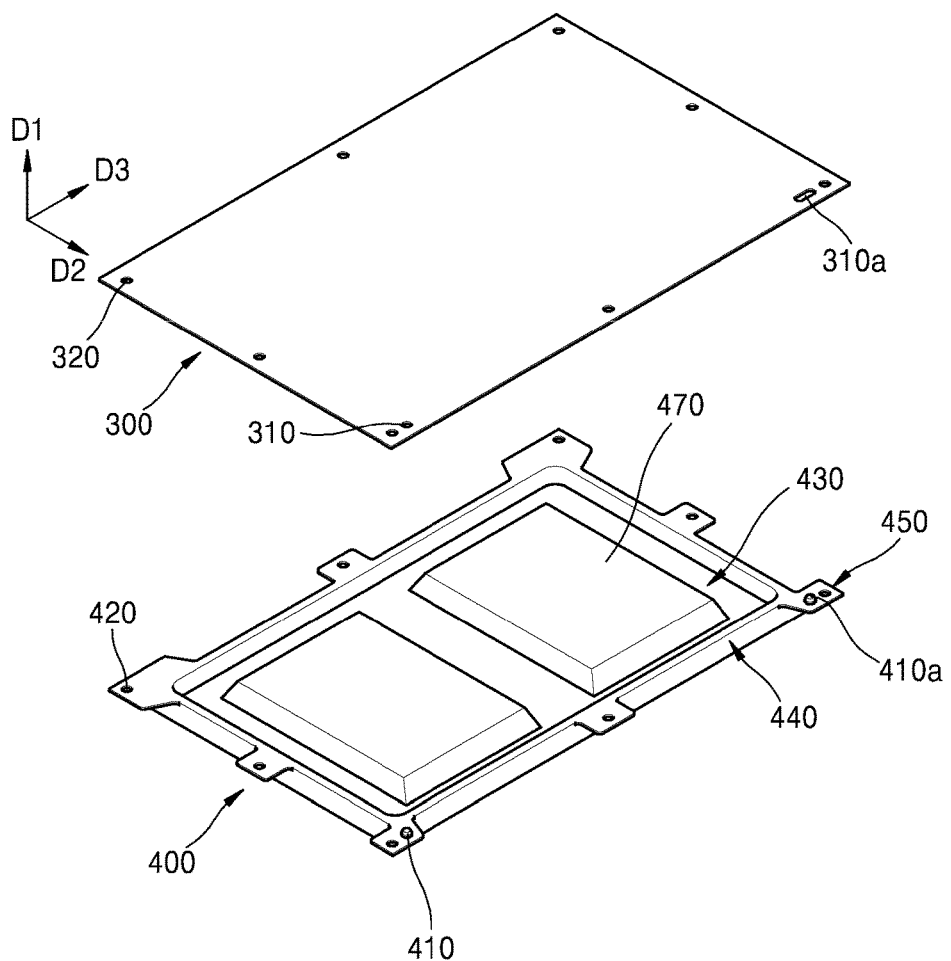
FIG. 5 is an exploded perspective view of a printed circuit board (PCB) and a cover shield of the display device illustrated in FIG. 4.
Figure 6:
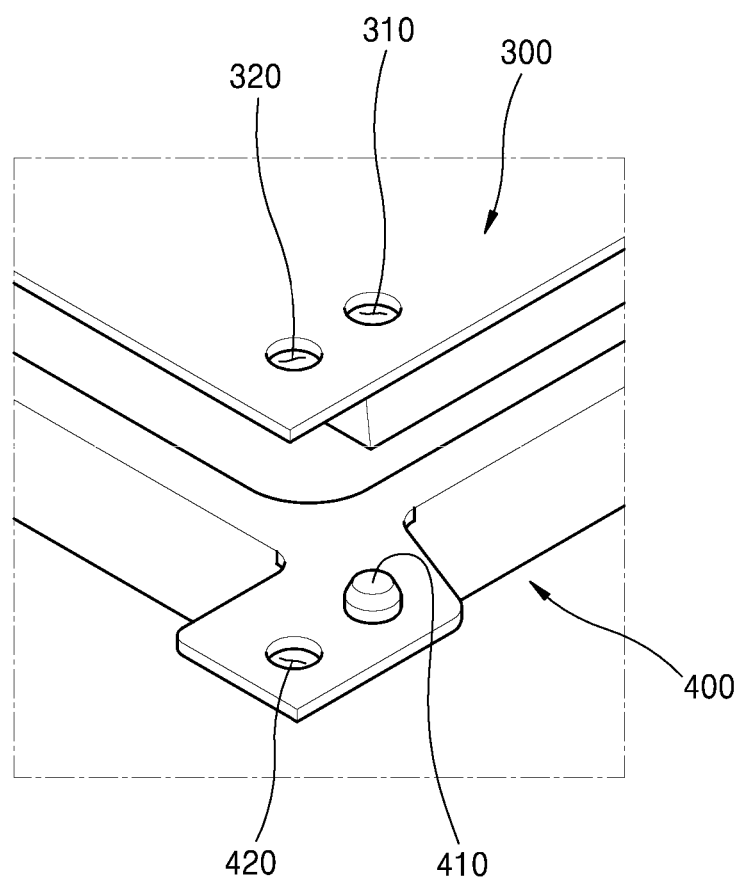
FIG. 6 is an enlarged perspective view of the PCB and the cover shield illustrated in FIG. 5.

FIG. 5 is an exploded perspective view of the PCB 300 and the cover shield 400 of the display device 1000 illustrated in FIG. 4. FIG. 6 is an enlarged perspective view of the PCB 300 and the cover shield 400 illustrated in FIG. 5.

Referring to FIGS. 4 to 6, the PCB 300 may include a guide hole 310 formed therethrough in a thickness direction D1 and may be coupled to the cover bottom 200 to be positioned on a rear surface of the cover bottom 200.

The PCB 300 may be shaped like a plate with a predetermined thickness. The PCB 300 may have a first surface that crosses (i.e. is transverse to) the thickness direction D1, a second surface that crosses the thickness direction D1 and is disposed in parallel to the first surface so as to face the first surface, and a plurality of lateral surfaces that connect the first and second surfaces. Although FIGS. 4 to 6 illustrate the PCB 300 shaped like a plate with a rectangular cross section, the cross section of the PCB 300 may have various different shapes in various embodiments.

A plurality of circuit components that generate a driving voltage and/or a control signal for driving the display panel 110 may be mounted on the PCB 300. For example, the plurality of circuit components may include various types of electronic devices such as a resistor, an inductor, a capacitor, a diode, or a transistor. The plurality of circuit components may be electrically connected to each other through a circuit pattern printed on the PCB 300 or in the PCB 300.

As illustrated in FIG. 6, the PCB 300 may include the guide hole 310. The guide hole 310 may be formed through the PCB 300 in the thickness direction D1 of the PCB 300. That is, the guide hole 310 may be formed through the first and second surfaces of the PCB 300. The guide hole 310 may be formed in a portion of a region of the PCB 300, in which circuit components are not installed and a circuit pattern is not printed.

The PCB 300 may be coupled to the cover bottom 200 to be positioned on the rear surface of the cover bottom 200. The PCB 300 positioned on the rear surface of the cover bottom 200 may be electrically connected to a driver of the display panel 110 accommodated in the cover bottom 200 through a connection member. The connection member may be formed of a flexible material and may be bent a plurality of numbers of times to extend to the rear surface of the cover bottom 200 over the lateral surface portions 220 of the cover bottom 200 in front of the cover bottom 200.

The cover shield 400 may include a guide protrusion 410 that protrudes from one surface at a position corresponding to the guide hole 310 so as to be inserted into the guide hole 310 of the PCB 300 and may be coupled to the cover bottom 200 so as to cover the PCB 300.

When the cover shield 400 is coupled to the cover bottom 200, the guide protrusion 410 may protrude from one surface of the cover shield 400 at a position corresponding to the guide hole 310 so as to be inserted into the guide hole 310 of the PCB 300, positioned in the rear surface of the cover bottom 200.

Here, one surface of the cover shield 400 from which the guide protrusion 410 protrudes may refer to a surface of the cover shield 400, which is directed toward the rear surface of the PCB 300 when the cover shield 400 and the cover bottom 200 are coupled. In addition, a direction in which the guide protrusion 410 protrudes may refer to a direction toward the rear surface of the PCB 300 on one surface of the cover shield 400, that is, an upward direction. The upper direction may be a direction parallel to the thickness direction D1 of the PCB 300.

A cross section of the guide protrusion 410 may correspond to a cross section of the guide hole 310. The size of the cross section of the guide protrusion 410 may correspond to or may be smaller than the size of the cross section of the guide hole 310. A protrusion length of the guide protrusion 410 may correspond to or may be smaller than a depth of the guide hole 310. Alternatively, the protrusion length of the guide protrusion 410 may be larger than the forming depth of the guide hole 310.

The guide protrusion 410 may constitute a single body along with the cover shield 400 (e.g., the guide protrusion 410 may be integrally formed as a part of the cover shield 400). The guide protrusion 410 may extend from one region of one surface of the cover shield 400. On the other hand, the guide protrusion 410 may be formed as a separate body from the cover shield 400 and may be coupled to one surface of the cover shield 400 using various methods such as adhesive tape, a mechanical coupling method, welding, or the like.

The cover shield 400 may cover the PCB 300 to protect the PCB 300. The cover shield 400 may have a substantially same area as an area of the PCB 300 so as to cover an entire region or most of an entire region of the PCB 300, or the cover shield 400 may have a smaller area than the area of the PCB 300. The cover shield 400 may have a cross section corresponding to the PCB 300.

The cover shield 400 may be entirely or partially formed of a metallic material. For example, the cover shield 400 may be formed of a material such as electrolytic galvanized iron (EGI). When the cover shield 400 is formed of a metallic material, the cover shield 400 may electrically shield a plurality of circuit components mounted on the PCB 300 to restrict electrical interference applied from outside of the cover shield 400.

Although not illustrated, the cover shield 400 may include a plurality of heat dissipation holes for externally dissipating heat emitted from the plurality of circuit components mounted on the PCB 300.

Figure 7:
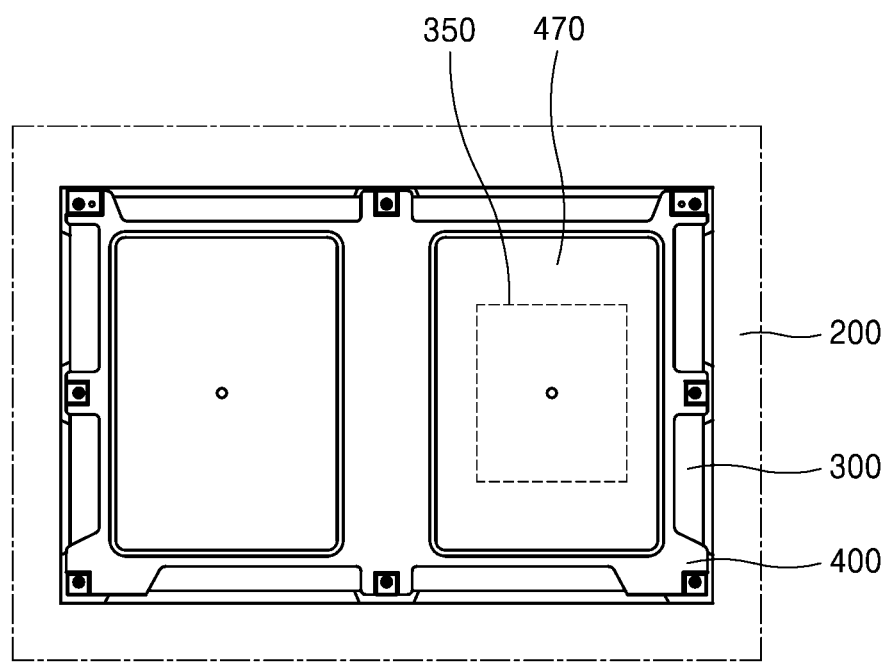
FIG. 7 is a rear-side view illustrating the PCB and the cover shield coupled to the cover bottom in the display device illustrated in FIG. 4.
Figure 8:
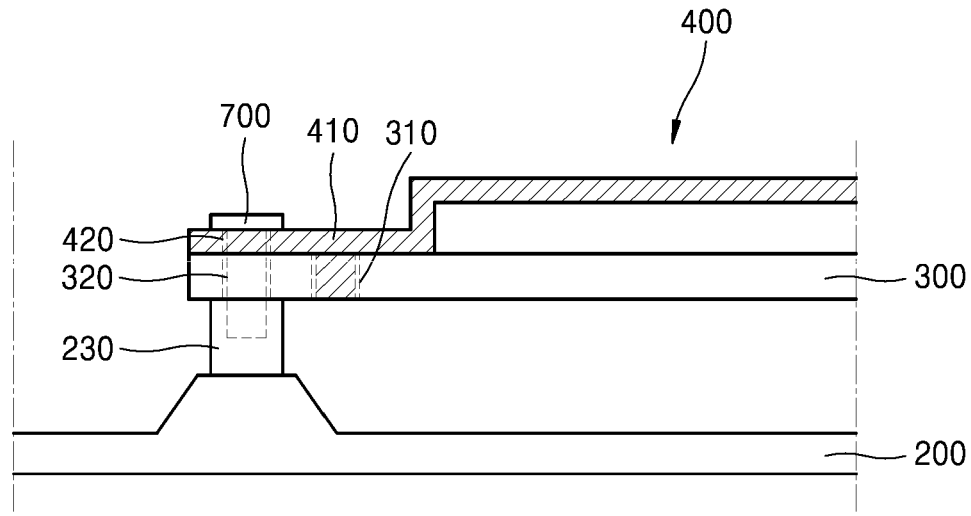
FIG. 8 is a cross-sectional view illustrating a coupling state of a cover bottom, a PCB, and a cover shield illustrated in FIG. 7.

FIG. 7 is a rear-side view illustrating the PCB 300 and the cover shield 400 coupled to the cover bottom 200 in the display device 1000 illustrated in FIG. 4. FIG. 8 is a cross-sectional view illustrating a coupling state of the cover bottom 200, the PCB 300, and the cover shield 400 illustrated in FIG. 7.

FIGS. 7 and 8 illustrate a coupling structure of the cover bottom 200, the PCB 300, and the cover shield 400.

The PCB 300 and the cover shield 400 may be coupled to the cover bottom 200 at the rear surface of the cover bottom 200 and, in this case, the guide protrusion 410 of the cover shield 400 may be inserted into the guide hole 310 of the PCB 300. The guide protrusion 410 of the cover shield 400 may be inserted into the guide hole 310 of the PCB 300 and, thus, the cover shield 400 may be guided to an accurate assembly position and coupling position.

That is, when the cover shield 400 is disposed on the PCB 300 positioned on the rear surface of the cover bottom 200, the cover shield 400 may be disposed on the PCB 300 so as to permit the guide protrusion 410 of the cover shield 400 to be inserted into the guide hole 310 of the PCB 300 and, thus, the cover shield 400 may be guided to a more accurate assembly position.

In the display device 1000 according to the present embodiment, the structure for guiding the assembly position of the cover shield 400 may be applied to the PCB 300 and the cover shield 400, differently from the conventional case. Accordingly, a shape of the cover shield 400 may be different from the cover shield 30 (refer to FIG. 1) according to the prior art. That is, according to the prior art, a structure for guiding an assembly position of the cover shield 30 is applied to the cover bottom 10 and the cover shield 30 and, thus, the cover shield 30 needs to have an end (which is the first end in FIG. 1) that contacts the rear surface of the cover bottom 10. Accordingly, the cover shield 30 according to the prior art may include three ends with different heights.

The cover shield 30 according to the prior art includes the first end 32 (flange portion) disposed on the rear surface of the cover bottom 10, the second end 36 disposed on the rear surface of the PCB 20 (refer to FIG. 1), and the third end 34 that covers the PCB 20 and is formed with a total of three ends. Accordingly, the cover shield 30 according to the prior art is easily bent, that is, has low bending stiffness with respect to external force applied to the cover shield 30 from an outside due to a height difference between the first end 32 and the third end 34.

In the display device 1000 according to the present embodiment, the structure of guiding the assembly position of the cover shield 400 may be changed and, thus, a shape of the cover shield 400 may be different from the conventional case. In the cover shield 400 of the display device 1000 according to the present embodiment, an end that contacts the rear surface of the cover bottom 200 may be omitted and, thus, the cover shield 400 may have two ends with different heights. That is, the cover shield 400 may include the guide protrusion 410 so as to be configured with a first end that contacts the PCB 300 and a second end that covers most of the region or surface area of the PCB 300.

The cover shield 400 with the above shape may have enhanced bending stiffness compared with the cover shield 30 according to the prior art. That is, a height difference between the first and second ends (or first and second surfaces) is smaller than a height difference between a lowermost end and an uppermost end in the cover shield 30 according to the prior art and, thus, the cover shield 400 according to the present embodiment may not be easily bent by external force applied to the cover shield 400 from an outside. This means that bending stiffness of the cover shield 400 is enhanced.

The bending stiffness of the cover shield 400 may be enhanced so as to minimize bending of the cover shield 400. Accordingly, lifting of an edge of the cover shield 400 with respect to the PCB 300 may be limited so as to reduce noise generated due to lifting of the edge of the cover shield 400.

The cover shield 400 according to the present embodiment may have enhanced bending stiffness and a reduced height difference between lowermost and uppermost ends and, thus, shape variation due to bending may be reduced. Accordingly, even if high external force is applied to the cover shield 400 from an outside, a shape variation value of the cover shield 400 is small (that is, plastic deformation is prevented) and, thus, restoring force may be maintained to restrict permanent deformation of the cover shield 400. Accordingly, defective products that are discarded due to permanent deformation of the cover shield 400 may be reduced in frequency.

The guide protrusion 410 of the cover shield 400 is maintained inserted into the guide hole 310 of the PCB 300 and, thus, relative movement of the cover shield 400 with respect to the PCB 300 (e.g., movement of a cover shield toward a lateral direction of a PCB) may be restricted. The cover shield 400 may thus be more fixedly assembled on or secured to the PCB 300, which better protects the PCB 300 and which enhances the coupling force between relative components and, thus, the durability of a device may also be enhanced.

The PCB 300 and the cover shield 400 may be sequentially arranged on the rear surface of the cover bottom 200 and, then, may be coupled to the cover bottom 200 through a coupling member 700. When a coupling procedure of the PCB 300 and the cover shield 400 is performed, the cover shield 400 may be stably maintained in a predetermined or fixed position with respect to the PCB 300 and, thus, a procedure of coupling the cover shield 400 to the cover bottom 200 may be more easily performed. That is, when a relative position between components is changed during the coupling procedure between components, the coupling procedure between components may not be easily performed. The cover shield 400 according to the present embodiment is maintained at a predetermined position with respect to the PCB 300 (a guide protrusion of a cover shied is inserted into a guide hole of a PCB) and, thus, the coupling procedure between components may be easily performed.

Referring back to FIG. 5, the PCB 300 may include a plurality of guide holes 310 and 310a and the cover shield 400 may include a plurality of guide protrusions 410 and 410a. The plurality of guide holes 310 and 310a may be formed in the PCB 300 and arranged in an external portion (e.g., a perimeter portion) of the PCB 300 and the plurality of guide protrusions 410 and 410a may be included in the cover shield 400 so as to correspond to the plurality of guide holes 310 and 310a.

Although FIG. 5 illustrates the case in which the PCB 300 includes the two guide holes 310 and 310a, the PCB 300 may include three or more guide holes. Although FIG. 5 illustrates the case in which the two guide holes 310 and 310a are arranged in respective corner regions (two corner regions spaced apart from each other in a direction D3) of the PCB 300, the two guide holes 310 and 310a may be arranged outside the corner region or may be respectively arranged in two corner regions so as to spaced apart from each other in a diagonal direction. The guide protrusions 410 and 410a may be variously formed so as to correspond to the number, shapes, and positions of the guide holes 310 and 310a.

The PCB 300 may include the plurality of guide holes 310 and 310a and the cover shield 400 may include the plurality of guide protrusions 410 and 410a so as to correspond to the PCB 300 and, thus, the cover shield 400 may be more accurately and fixedly guided to an assembly position. That is, the plurality of guide protrusions 410 and 410a are inserted into the plurality of guide holes 310 and 310a, respectively, and, thus, movement of the cover shield 400 with respect to the PCB 300 may be more effectively restricted.

In detail, the cover shield 400 may be disposed on the PCB 300 and, then, movement of the cover shield 400 in a lateral direction and rotation of the PCB 300 with respect to a perpendicular axis to the rear surface may also be more effectively restricted.

When the PCB 300 includes the plurality of guide holes 310 and 310a, one 310 of the plurality of guide holes may be shaped like a hole (e.g., the hole may be substantially circular) and the other one 310a may be shaped like a long hole (e.g., the hole may include an extended portion between two semi-circular portions). That is, as illustrated in FIG. 5, the two guide holes 310 and 310a may have different shapes. Here, the hole shape may refer to a shape of the guide hole 310 with a circular cross section and the long hole shape may refer to a shape of the guide hole 310a with a cross section formed by adding semicircles to opposite sides of a rectangular shape. The long hole shape may refer to a shape of a guide hole with an oval or elliptical cross section.

When one 310 of the plurality of guide holes is shaped like a hole and the other one 310a is shaped like a long hole, if the PCB 300 expands or contracts by heat, interference between the PCB 300 and the cover shield 400 may be restricted.

That is, since the PCB 300 and the cover shield 400 are formed of different materials, the PCB 300 and the cover shield 400 may have different expansion and contraction coefficients due to heat to cause relative movement therebetween. When the plurality of guide holes 310 and 310a are inserted into the guide protrusions 410 and 410a, respectively, expansion and contraction of the PCB 300 due to heat may be restricted by the guide protrusions 410 and 410a. In this case, the PCB 300 may be deformed and, in a serious case, the PCB 300 may be damaged and may crack or the guide protrusion 410 included in the cover shield 400 may be damaged.

When one 310a of the plurality of guide holes is shaped like a long hole, even if the PCB 300 expands or contracts due to heat, the guide protrusion 410a inserted into the guide hole 310a shaped like a long hole does not restrict expansion and contraction of the PCB 300 and, thus, a problem due to interference with the cover shield 400 during expansion and contraction of the PCB 300 may be minimized.

As illustrated in FIG. 6, the guide protrusion 410 may include an end portion shaped like a chamfer. That is, the guide protrusion 410 may be formed in such a way that a front surface is inclined with a lateral surface and, accordingly, a size of a cross section of the guide protrusion 410 may be reduced in a protruding direction. Here, the protruding direction corresponds to a perpendicular of one surface of the cover shield 400 including the guide protrusion 410.

The size of the cross section of the guide protrusion 410 is reduced in the protruding direction and, thus, the guide protrusion 410 may be more easily inserted into the guide hole 310 of the PCB 300.

Referring back to FIGS. 5 and 8, the cover bottom 200 may include a plurality of self-clinching nuts 230 protruding from a rear surface. The self-clinching nuts 230 may be any type of swage or self-clinching nut, including for example, a PEM® nut, which is a brand of self-clinching nut by Penn Engineering & Manufacturing Corp. Such self-clinching nuts may be referred to herein as "pemnuts." In this case, the PCB 300 may include a plurality of first coupling holes 320 that are disposed at positions corresponding to the plurality of pemnuts 230, respectively, and the cover shield 400 may include the plurality of second coupling holes 420 that are disposed at positions corresponding to the plurality of first coupling holes 320, respectively.

The pemnut 230 may protrude in a perpendicular direction to the rear surface of the cover bottom 200 from the rear surface of the cover bottom 200 and may have a circumferential shape. The pemnut 230 may include a hollow formed therein and a screw thread may be formed on an inner circumference surface of the hollow and, thus, the coupling member 700 such as a screw may be inserted into and fixed to the pemnut 230.

The pemnut 230 may be integrally formed with the cover bottom 200 to form a single body. The pemnut 230 may be formed of the same material as the cover bottom 200 or formed of a conductive material. A protruding end portion of the pemnut 230 may have a predetermined height difference from the rear surface of the cover bottom 200.

The PCB 300 may be accommodated on the protruding end portion of the pemnut 230 to be positioned on the rear surface of the cover bottom 200. The PCB 300 may be accommodated on protruding end portion of the pemnut 230 and, thus, may be spaced apart from the rear surface of the cover bottom 200 by a predetermined interval.

The PCB 300 may include the plurality of first coupling holes 320 at positions that correspond to the plurality of pemnuts 230, respectively. Although not illustrated, the protruding end portion of the pemnut 230 may include a boss portion (e.g., a protruding feature or portion) that is inserted into the first coupling hole 320 of the PCB 300 to guide a position of the PCB 300 and, in this case, the boss portion may include another hollow that is formed therein to correspond to the hollow of the pemnut 230. The boss portion of the protruding end portion of the pemnut 230 may be shaped like a ring. A size of a cross section of the boss portion may be smaller than that of the pemnut 230.

The cover shield 400 may also include the plurality of second coupling holes 420 that are disposed at positions corresponding to the plurality of pemnuts 230 and the plurality of first coupling holes 320, respectively. The cover shield 400 may be configured in such a way that the guide protrusion 410 is inserted into the guide hole 310 of the PCB 300 so as to guide a position of the cover shield 400.

The coupling member 700 may be inserted into and fixed to a hollow (which includes a hollow of a boss portion) of the pemnut 230 through the second coupling hole 420 of the cover shield 400 and the first coupling hole 320 of the PCB 300 so as to couple the cover shield 400 and the PCB 300 to the cover bottom 200.

Referring to FIG. 5, the cover shield 400 may include a base portion 430 that is shaped like a plate and covers the rear surface of the PCB 300, a plurality of lateral portions 440 that are bent and that extend from each edge of the base portion 430, and a plurality of extension portions 450 that are bent and extend outward from the plurality of lateral portions 440. In this case, the guide protrusion 410 and the second coupling hole 420 may be disposed in the extension portion 450 of the cover shield 400.

The cover shield 400 may include the base portion 430 and the extension portion 450, which form a predetermined height difference, and the plurality of lateral portions 440 that connect the base portion 430 and the extension portion 450. When the cover shield 400 is disposed on the rear surface of the PCB 300, the base portion 430 is spaced apart from the rear surface of the PCB 300 and the extension portion 450 with a height difference with the base portion 430 may be disposed to contact the rear surface of the PCB 300.

The formation position and the number of the extension portions 450 of the cover shield 400 may be increased or reduced according to the formation position and the number of the second coupling holes 420.

Referring to FIGS. 5 and 7, the display device 1000 according to the present embodiment may further include a heat dissipation member 350 interposed between the PCB 300 and the cover shield 400 and the cover shield 400 may include a protrusion portion 470 that protrudes toward the heat dissipation member 350 from one surface of the base portion 430 to contact the heat dissipation member 350.

Heat generated from the PCB 300 may be externally discharged through the protrusion portion 470 of the cover shield 400 that contacts the heat dissipation member 350, thereby enhancing heat dissipation performance of the PCB 300.

Figure 9:
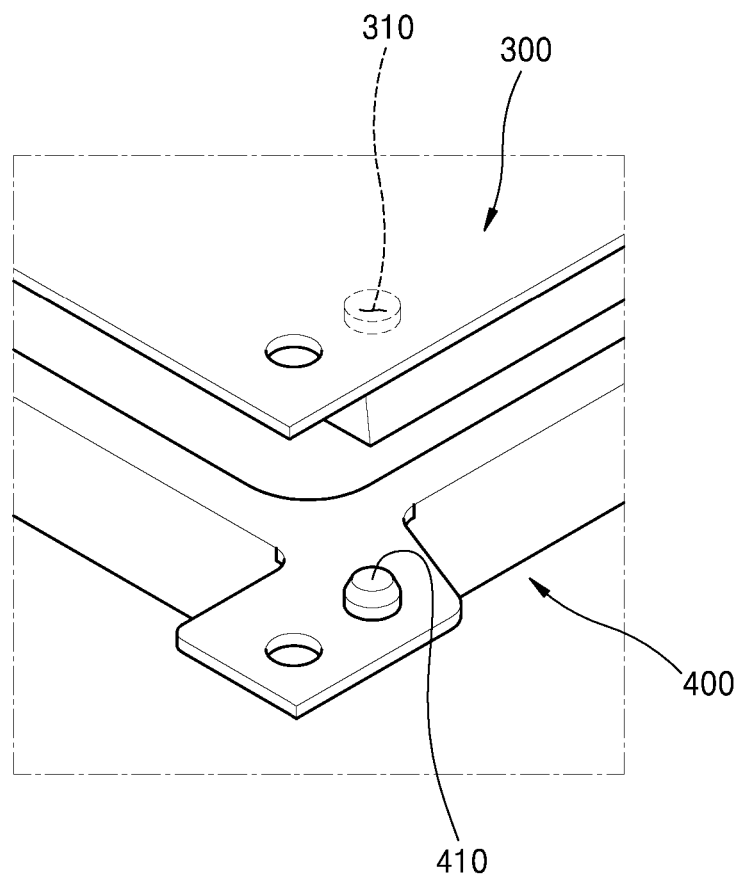
FIG. 9 is an enlarged perspective view illustrating a modified example of the PCB illustrated in FIG. 6.

FIG. 9 is an enlarged perspective view illustrating a modified example of the PCB 300 illustrated in FIG. 6.

Referring to FIG. 9, one end of the guide hole 310 of the PCB 300 in the thickness direction D1 of the PCB 300 may be closed (e.g., the guide hole 310 does not extend completely through the thickness of the PCB 300) and the guide protrusion 410 of the cover shield 400 may be inserted into the guide hole 310 of the PCB 300 to contact the closed one end of the guide hole 310.

The PCB 300 may include the guide hole 310 with the closed one end and the guide hole 310 may be concaved in the thickness direction D1 of the PCB 300 from one surface that crosses the thickness direction D1 of the PCB 300.

The guide protrusion 410 of the cover shield 400 may protrude from one surface of the cover shield 400 so as to correspond to a convex depth of the guide hole 310. That is, the protruding height of the guide protrusion 410 may correspond to the convex depth of the guide hole 310. The guide protrusion 410 may be inserted into the guide hole 310 and may contact the closed one end of the guide hole 310.

As such, the protruding end portion of the guide protrusion 410 may contact the closed one end of the guide hole 310 so as to increase a contact area between the cover shield 400 and the PCB 300. Accordingly, the cover shield 400 may be more fixedly supported by the PCB 300 and external force applied to the cover shield 400 may be more uniformly distributed on the PCB 300.

Figure 10:
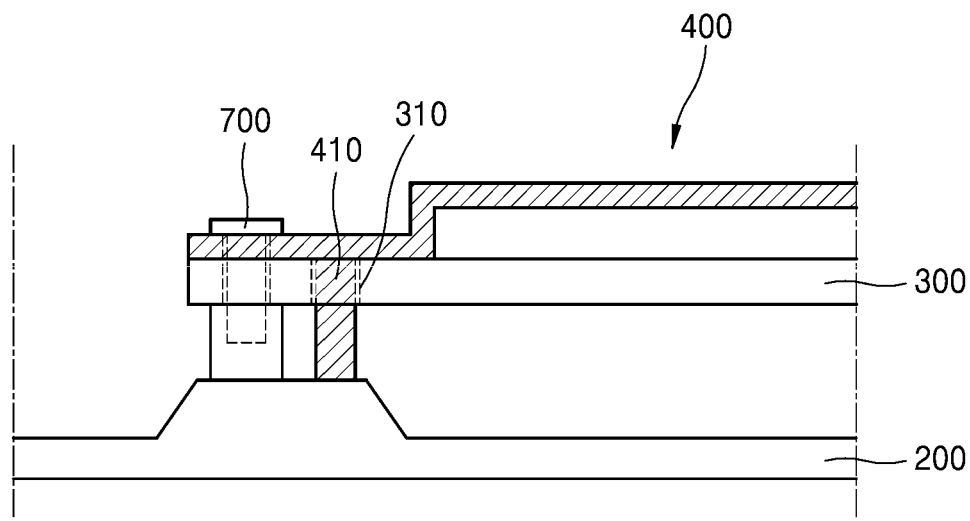
FIG. 10 is a cross-sectional view illustrating a modified example of a guide protrusion included in the cover shield illustrated in FIG. 8.

FIG. 10 is a cross-sectional diagram illustrating a modified example of the guide protrusion 410 included in the cover shield 400 illustrated in FIG. 8.

Referring to FIG. 10, the guide protrusion 410 of the cover shield 400 may extend to contact the rear surface of the cover bottom 200 through the guide hole 310 of the PCB 300. That is, the guide protrusion 410 may protrude from one surface of the cover shield 400 and, when the cover shield 400 is coupled to the cover bottom 200 so as to cover the PCB 300, the guide protrusion 410 may be inserted into the guide hole 310 and, then, may extend further to contact the rear surface of the cover bottom 200 through the guide hole 310.

As such, the guide protrusion 410 of the cover shield 400 may extend to contact the rear surface of the cover bottom 200 and, thus, the cover shield 400 may be more fixedly supported by the cover bottom 200. In detail, when external force that presses the cover shield 400 toward the cover shield 400 is applied, the cover shield 400 is supported by the cover bottom 200 as well as the PCB 300 and, thus, external force applied to the cover shield 400 may be distributed to the PCB 300 and the cover bottom 200, thereby enhancing stiffness of the cover shield 400. Resistance force of the cover shield 400 with respect to the external force that presses the cover shield 400 may be increased so as to restrict deformation of the cover shield 400 and to more stably protect the PCB 300.

Figure 11:
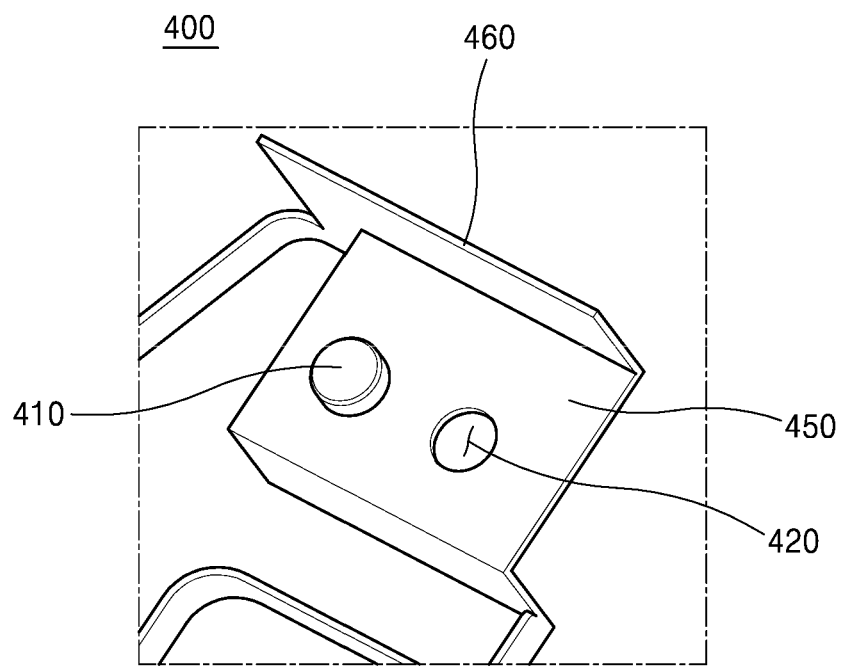
FIG. 11 is an enlarged perspective view illustrating a modified example of the cover shield illustrated in FIG. 5.

FIG. 11 is an enlarged perspective view illustrating a modified example of the cover shield 400 illustrated in FIG. 5.

Referring to FIG. 11, the cover shield 400 may further include a reinforcement portion 460 that is bent and extends from the extension portion 450 with the guide protrusion 410 disposed therein so as to cover a lateral surface of the PCB 300 while the PCB 300 is covered.

The reinforcement portion 460 is disposed to cover the lateral surface of the PCB 300 and, thus, relative movement of the cover shield 400 with respect to the PCB 300 may be effectively restricted. In addition, a portion of the reinforcement portion 460 extends from a lateral portion 440 of the cover shield 400 and, thus, the reinforcement portion 460 may enhance structural stiffness of the extension portion 450.

According to exemplary embodiments of the present disclosure, since a guide structure for guiding an assembly position of a cover shield may be applied to a PCB and the cover shield, the cover shield may be coupled to the PCB and a cover bottom such that a guide protrusion of the cover shield is inserted into a guide hole of the PCB and, accordingly, an end of the cover shield may be omitted, embodying a display device including a cover shield with enhance bending stiffness.

According to exemplary embodiments of the present disclosure, a cover shield having a smaller number of ends than in the conventional case may be prevented from being lifted at a lower end of the cover shield and, accordingly, noise between the cover shield and the PCB may be minimized, embodying a display device with overall enhanced product quality.

According to exemplary embodiments of the present disclosure, the bending stiffness of the cover shield may be enhanced and a shape of the cover shield may be changed so as to reduce shape variation of the cover shield due to external force applied to the cover shield and, accordingly, a defective rate of the cover shield may be minimized, embodying a display device with reduced manufacturing costs.

The present disclosure described above may be variously substituted, altered, and modified by those skilled in the art to which the present disclosure pertains without departing from the scope and sprit of the present disclosure. Therefore, the present disclosure is not limited to the above-mentioned exemplary embodiments and the accompanying drawings.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a display module;
a cover bottom configured to accommodate and support the display module;
a printed circuit board (PCB) including a guide hole formed therethrough in a thickness direction of the PCB and a first coupling hole spaced apart from the guide hole, the PCB physically coupled to the cover bottom and positioned adjacent to a rear surface of the cover bottom;
a cover shield including a guide protrusion that protrudes from a surface of the cover shield at a position corresponding to the guide hole of the PCB, and a second coupling hole spaced apart from the guide protrusion, the guide protrusion configured to be inserted into the guide hole and to guide a position of the second coupling hole to correspond with a position of the first coupling hole, the cover shield configured to be coupled to the cover bottom to cover the PCB; and
a coupling member extending through the first and second coupling holes,
wherein the guide protrusion constitutes a single body along with the cover shield.

2. The display device according to claim 1, wherein:
one end of the guide hole in the thickness direction is closed; and
the guide protrusion is inserted into the guide hole to contact the closed one end of the guide hole.

3. The display device according to claim 1, wherein the guide protrusion extends through the guide hole and contacts the rear surface of the cover bottom.

4. The display device according to claim 1, wherein:
the PCB includes a plurality of guide holes that are arranged along a perimeter portion of the PCB; and
the cover shield includes a plurality of guide protrusions that are disposed to correspond to the plurality of guide holes.

5. The display device according to claim 4, wherein a first portion of the plurality of guide holes are shaped like a hole and a second portion of the plurality of guide holes are shaped like a long hole.

6. The display device according to claim 1, wherein the guide protrusion comprises an end shaped like a chamfer.

7. The display device according to claim 1, wherein:
the cover bottom includes a plurality of self-clinching nuts that protrude from the rear surface;
the PCB includes a plurality of first coupling holes disposed at positions corresponding to the plurality of self-clinching nuts, respectively; and
the cover shield includes a plurality of second coupling holes disposed at positions corresponding to the plurality of first coupling holes, respectively.

8. The display device according to claim 7, wherein:
the cover shield includes:
a base plate that covers a rear surface of the PCB;
a plurality of lateral portions that extend from respective edges of the base plate; and
a plurality of extension portions that extend outward from the plurality of lateral portions; and
the guide protrusion and the plurality of second coupling holes are positioned in the extension portions.

9. The display device according to claim 8, further comprising a heat dissipation member interposed between the PCB and the cover shield,
wherein the cover shield includes a protrusion portion that protrudes toward the heat dissipation member from a surface of the base plate to contact the heat dissipation member.

10. The display device according to claim 8, wherein the cover shield further includes at least one reinforcement portion extend from at least one of the extension portions, with the guide protrusion disposed therein to cover a lateral surface of the PCB while the PCB is covered.

11. A display device comprising:
a display module;
a cover bottom physically coupled to the display module;
a printed circuit board (PCB) physically coupled to the cover bottom, the cover bottom positioned between the display module and the PCB, the PCB including a guide hole and a first coupling hole;
a cover shield physically coupled to the PCB, the cover shield including a guide protrusion that protrudes from a surface of the cover shield and extends at least partially into the guide hole of the PCB, and a second coupling hole, the guide protrusion configured to guide a position of the second coupling hole to correspond with a position of the first coupling hole; and
a coupling member extending through the first and second coupling holes,
wherein the guide protrusion constitutes a single body along with the cover shield.

12. The display device according to claim 11, wherein the guide hole extends partially into the PCB to an inner surface of the PCB, and the guide protrusion extends into the guide hole and contacts the inner surface of the PCB.

13. The display device according to claim 11, wherein the guide hole extends through the PCB, and the guide protrusion extends through the guide hole and contacts a surface of the cover bottom.

14. The display device according to claim 1, wherein the guide protrusion is integrally formed as a part of the cover shield.

15. The display device according to claim 11, wherein the guide protrusion is integrally formed as part of the cover shield.

16. A display device, comprising:
a display module;
a cover bottom configured to accommodate and support the display module;
a printed circuit board (PCB) including a guide hole formed therethrough in a thickness direction of the PCB, the PCB physically coupled to the cover bottom and positioned adjacent to a rear surface of the cover bottom; and a cover shield including a guide protrusion that protrudes from a surface of the cover shield at a position corresponding to the guide hole of the PCB, so as to be inserted into the guide hole and configured to be coupled to the cover bottom to cover the PCB, wherein:

the guide protrusion constitutes a single body along with the cover shield, the cover bottom includes a plurality of self-clinching nuts that protrude from the rear surface;

the PCB includes a plurality of first coupling holes disposed at positions corresponding to the plurality of self-clinching nuts, respectively; and the cover shield includes a plurality of second coupling holes disposed at positions corresponding to the plurality of first coupling holes, respectively.

17. The display device according to claim 16, wherein:
one end of the guide hole in the thickness direction is closed; and
the guide protrusion is inserted into the guide hole to contact the closed one end of the guide hole.

18. The display device according to claim 16, wherein the guide protrusion extends through the guide hole and contacts the rear surface of the cover bottom.

19. The display device according to claim 16, wherein:
the cover shield includes:
a base plate that covers a rear surface of the PCB;
a plurality of lateral portions that extend from respective edges of the base plate; and
a plurality of extension portions that extend outward from the plurality of lateral portions; and
the guide protrusion and the plurality of second coupling holes are positioned in the extension portions.

20. The display device according to claim 19, further comprising a heat dissipation member interposed between the PCB and the cover shield,
wherein the cover shield includes a protrusion portion that protrudes toward the heat dissipation member from a surface of the base plate to contact the heat dissipation member.

* * * * *